(12) United States Patent
Tsai et al.

(10) Patent No.: US 10,978,362 B2
(45) Date of Patent: Apr. 13, 2021

(54) SEMICONDUCTOR STRUCTURE WITH CONDUCTIVE STRUCTURE

(71) Applicant: Taiwan Semiconductor Manufacturing Co., Ltd., Hsinchu (TW)

(72) Inventors: Pei-Chun Tsai, Zhongli (TW); Wei-Sen Chang, Jinsha Township, Kinmen County (TW); Tin-Hao Kuo, Hsinchu (TW); Hao-Yi Tsai, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/683,619

(22) Filed: Nov. 14, 2019

(65) Prior Publication Data
US 2020/0083125 A1    Mar. 12, 2020

Related U.S. Application Data

(60) Continuation of application No. 15/938,324, filed on Mar. 28, 2018, now Pat. No. 10,490,468, which is a
(Continued)

(51) Int. Cl.
*H01L 21/66* (2006.01)
*H01L 23/00* (2006.01)
(Continued)

(52) U.S. Cl.
CPC .............. *H01L 22/32* (2013.01); *G01R 1/073* (2013.01); *G01R 31/00* (2013.01); *G01R 31/28* (2013.01); *G01R 31/50* (2020.01);
*H01L 21/486* (2013.01); *H01L 21/4853* (2013.01); *H01L 21/565* (2013.01); *H01L 21/78* (2013.01);
(Continued)

(58) Field of Classification Search
CPC ......... H01L 22/32; H01L 22/20; H01L 22/14; H01L 23/5385; H01L 23/5386; H01L 23/5389; H01L 23/3114; H01L 21/4853; H01L 21/486; H01L 21/565; H01L 24/02; H01L 24/03; H01L 24/05; H01L 24/13; H01L 25/105; H01L 25/50
USPC .......... 257/48, 737, 774, 762, 780, E23.008, 257/E23.01, E23.02, E23.023, E23.068, 257/E21.502, E21.504, E21.506, E21.531;
(Continued)

(56) References Cited

U.S. PATENT DOCUMENTS

| | | | |
|---|---|---|---|
| 5,872,399 A | | 2/1999 | Lee |
| 6,103,552 A | * | 8/2000 | Lin .................. H01L 24/03 257/E21.508 |

(Continued)

*Primary Examiner* — Dao H Nguyen
(74) *Attorney, Agent, or Firm* — Birch, Stewart, Kolasch & Birch, LLP

(57) ABSTRACT

A method for forming a semiconductor device structure and method for forming the same are provided. The method includes forming a conductive pad over the substrate, and forming a protection layer over the conductive pad. The method also includes forming a conductive structure accessibly arranged through the protection layer and electrically connected to the conductive pad, and the conductive structure has a curved top surface. A lowest point of the curved top surface of the conductive structure is higher than a topmost surface of the protection layer.

20 Claims, 11 Drawing Sheets

Related U.S. Application Data division of application No. 15/288,041, filed on Oct. 7, 2016, now Pat. No. 9,935,024.

(60) Provisional application No. 62/328,854, filed on Apr. 28, 2016.

(51) Int. Cl.

| | | |
|---|---|---|
| *H01L 21/78* | (2006.01) | |
| *H01L 21/48* | (2006.01) | |
| *H01L 21/56* | (2006.01) | |
| *H01L 23/538* | (2006.01) | |
| *H01L 23/31* | (2006.01) | |
| *H01L 25/10* | (2006.01) | |
| *H01L 25/00* | (2006.01) | |
| *H01L 23/498* | (2006.01) | |
| *H01L 25/065* | (2006.01) | |
| *G01R 31/28* | (2006.01) | |
| *G01R 31/00* | (2006.01) | |
| *G01R 1/073* | (2006.01) | |
| *G01R 31/50* | (2020.01) | |

(52) U.S. Cl.
CPC .............. *H01L 22/14* (2013.01); *H01L 22/20* (2013.01); *H01L 23/3114* (2013.01); *H01L 23/5385* (2013.01); *H01L 23/5386* (2013.01); *H01L 23/5389* (2013.01); *H01L 24/02* (2013.01); *H01L 24/03* (2013.01); *H01L 24/05* (2013.01); *H01L 24/13* (2013.01); *H01L 24/19* (2013.01); *H01L 24/20* (2013.01); *H01L 25/105* (2013.01); *H01L 25/50* (2013.01); *H01L 21/4857* (2013.01); *H01L 23/3128* (2013.01); *H01L 23/49811* (2013.01); *H01L 23/49816* (2013.01); *H01L 23/5383* (2013.01); *H01L 23/5384* (2013.01); *H01L 24/96* (2013.01); *H01L 25/0657* (2013.01); *H01L 2224/02373* (2013.01); *H01L 2224/02377* (2013.01); *H01L 2224/0392* (2013.01); *H01L 2224/03831* (2013.01); *H01L 2224/03845* (2013.01); *H01L 2224/0401* (2013.01); *H01L 2224/04105* (2013.01); *H01L 2224/05008* (2013.01); *H01L 2224/05024* (2013.01); *H01L 2224/05569* (2013.01); *H01L 2224/12105* (2013.01); *H01L 2224/13026* (2013.01); *H01L 2224/19* (2013.01); *H01L 2224/20* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/96* (2013.01); *H01L 2225/0651* (2013.01); *H01L 2225/06568* (2013.01); *H01L 2225/1035* (2013.01); *H01L 2225/1058* (2013.01); *H01L 2924/15311* (2013.01)

(58) Field of Classification Search
USPC .............. 438/17, 106, 108, 613; 324/750.19, 324/755.01
See application file for complete search history.

(56) References Cited

U.S. PATENT DOCUMENTS

| | | |
|---|---|---|
| 6,198,169 B1 | 3/2001 | Kobayashi et al. |
| 7,276,923 B2 | 10/2007 | Takemoto et al. |
| 7,456,089 B2 * | 11/2008 | Aiba .................... H01L 23/3114 257/E23.021 |
| 7,786,581 B2 | 8/2010 | Kang et al. |
| 8,198,699 B1 | 6/2012 | Xie et al. |
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,052,341 B2 | 6/2015 | Shiraishi et al. |
| 9,171,782 B2 | 10/2015 | Hau-Riege et al. |
| 9,754,906 B2 * | 9/2017 | Tsai .................... H01L 24/11 |
| 2002/0097060 A1 | 7/2002 | Maekawa et al. |
| 2002/0105076 A1 | 8/2002 | Lin |
| 2010/0301334 A1 | 12/2010 | Nishimura et al. |
| 2011/0193220 A1 * | 8/2011 | Kuo .................... H01L 24/11 257/737 |
| 2011/0291288 A1 | 12/2011 | Wu et al. |
| 2013/0062760 A1 | 3/2013 | Hung et al. |
| 2013/0062761 A1 | 3/2013 | Lin et al. |
| 2013/0134594 A1 | 5/2013 | Machida |
| 2013/0140690 A1 * | 6/2013 | Lin .................... H01L 24/05 257/737 |
| 2013/0168848 A1 | 7/2013 | Lin et al. |
| 2013/0264684 A1 | 10/2013 | Yu et al. |
| 2013/0292827 A1 | 11/2013 | Kuo et al. |
| 2013/0307140 A1 | 11/2013 | Huang et al. |
| 2014/0124928 A1 | 5/2014 | Lin et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0001712 A1 | 1/2015 | Daubenspeck et al. |
| 2015/0015288 A1 | 1/2015 | Ma |
| 2015/0076688 A1 | 3/2015 | Daubenspeck et al. |
| 2015/0171040 A1 | 6/2015 | Thacker et al. |
| 2017/0269126 A1 | 9/2017 | Liao et al. |

\* cited by examiner

SEMICONDUCTOR STRUCTURE WITH CONDUCTIVE STRUCTURE

CROSS REFERENCE TO RELATED APPLICATIONS

This application is a Continuation application of U.S. patent application Ser. No. 15/938,324, filed on Mar. 28, 2018, which is a Divisional application of U.S. patent application Ser. No. 15/288,041, filed on Oct. 7, 2016, which claims the benefit of U.S. Provisional Application No. 62/328,854, filed on Apr. 28, 2016, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

A wafer level package (WLP) structure is used as one of the package structures for semiconductor components of electronic products. An increased number of input-output (I/O) electrical contacts combined with increased demand for high performance integrated circuits (ICs) has led to the development of fan-out type WLP structures enabling minimum pitch relief of dense for the I/O electrical contacts.

Although existing WLP structures and methods of fabricating wafer-level packages have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
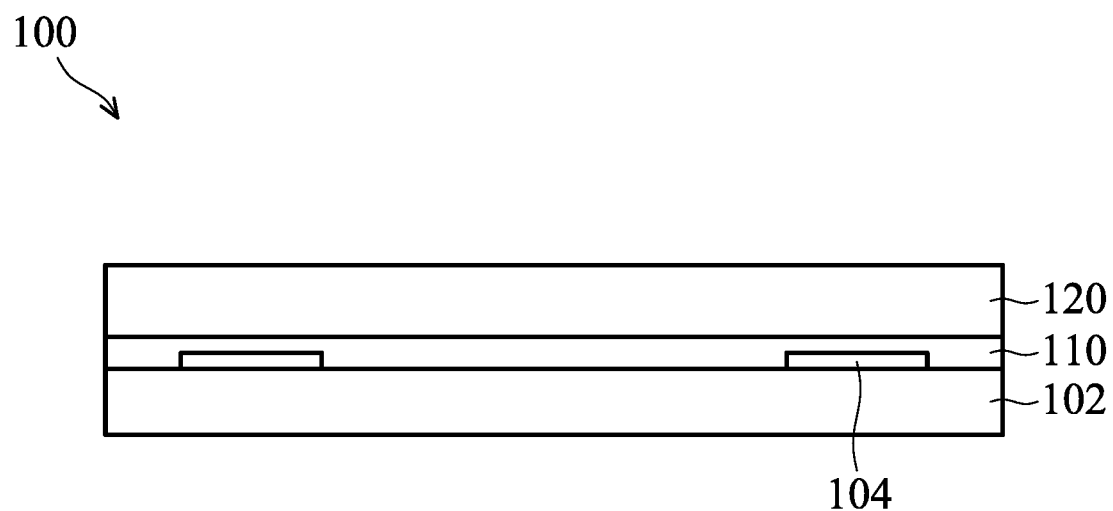
FIGS. 1A-1I show cross-sectional representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor device structure and method for forming the same are provided. FIGS. 1A-1I show cross-sectional representations of various stages of forming a semiconductor device structure, in accordance with some embodiments of the disclosure. The semiconductor device structure is applied to a wafer level package (WLP).

Referring to FIG. 1A, a first wafer 100 is received, and the first wafer 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A first inter-layer dielectric (ILD) layer 110 is formed over the substrate 102, and a second ILD layer 120 is formed over the first ILD layer 110. In some embodiments, the first ILD layer 110 is made of silicon oxide (SiOx), silicon nitride (SixNy), silicon oxynitride (SiON), or combinations thereof. In some embodiments, the second ILD layer 120 is made of silicon oxide (SiOx), silicon nitride (SixNy), silicon oxynitride (SiON) or combinations thereof. In some embodiments, the first ILD layer 110 is formed by plating, electroless plating, sputtering or chemical vapor deposition (CVD). In some embodiments, the second ILD layer 120 is formed by plating, electroless plating, sputtering or chemical vapor deposition (CVD).

The device elements 104 are formed in the first ILD layer 110. The device elements 104 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements 104, such as deposition, etching, implantation, photolithography, annealing, and/or other applicable processes. In some embodiments, the device elements 104 are formed in the substrate 102 in a front-end-of-line (FEOL) process.

The substrate 102 may include various doped regions such as p-type wells or n-type wells). Doped regions may be doped with p-type dopants, such as boron or $BF_2$, and/or n-type dopants, such as phosphorus (P) or arsenic (As). The doped regions may be formed directly on the substrate 102, in a P-well structure, in an N-well structure, or in a dual-well structure.

The substrate 102 may further include isolation features (not shown), such as shallow trench isolation (STI) features or local oxidation of silicon (LOCOS) features. Isolation features may define and isolate various device elements.

Figure 1B:
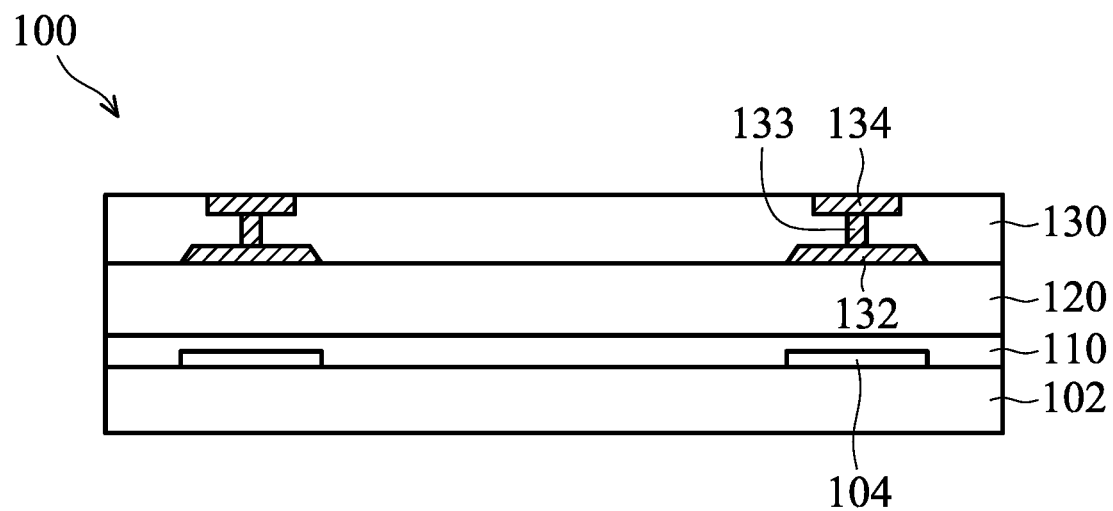

As shown in FIG. 1B, after the second ILD layer 120 is formed, an inter-metal dielectric (IMD) layer 130 is formed over the second ILD layer 120, in accordance with some embodiments of the disclosure.

The IMD layer 130 is made of silicon oxide (SiOx), silicon nitride (SixNy), silicon oxynitride (SiON), dielectric material(s) with low dielectric constant (low-k), or combinations thereof. In some embodiments, the IMD layer 130 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the IMD layer 130 is deposited by a plasma enhanced chemical vapor deposition (PECVD) process or by a spin coating process.

A first metal layer 132, a via 133 and a second metal layer 134 are formed in the IMD layer 130. The first metal layer 132 is electrically connected to the device elements 104 through various metallic lines and vias in the second ILD layer 120 (not explicitly shown in the instant figure). The IMD layer 130, the first metal layer 132, the via 133 and the second metal layer 134 are collectively called a redistribution layer (RDL) structure and are formed in a back-end-of-line (BEOL) process.

The first metal layer 132, the via 133 and the second metal layer 134 are independently made of copper (Cu), copper alloy, aluminum (Al), aluminum alloy, tungsten (W), tungsten alloy, titanium (Ti), titanium alloy, tantalum (Ta) or tantalum alloy. In some embodiments, the first metal layer 132, the via 133 and the second metal layer 134 are formed by a plating process, electroless plating process, sputtering process or chemical vapor deposition (CVD) process.

Figure 1C:
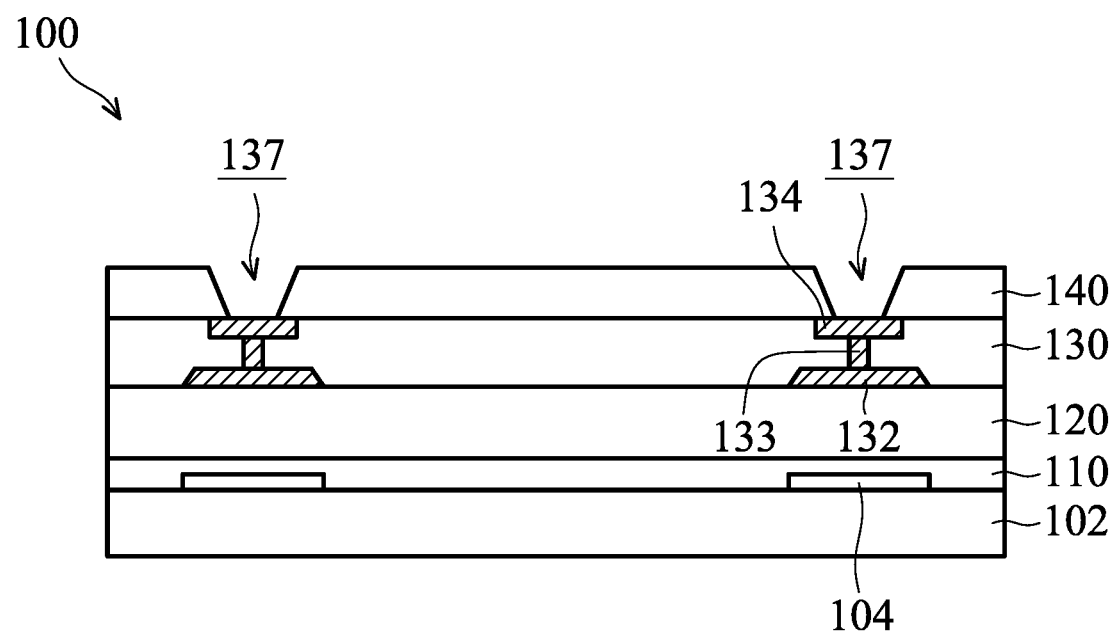

As shown in FIG. 1C, after the RDL structure is formed, an insulating layer 140 is formed over the IMD layer 130, in accordance with some embodiments of the disclosure. Afterwards, openings 137 are formed in the insulating layer 140 to expose the top surface of the second metal layer 134.

In some embodiments, the insulating layer 140 is made of polybenzoxazole (PBO), benzocyclobuten (BCB), silicone, acrylates, siloxane, or combinations thereof. In some embodiments, the insulating layer 140 is formed by a plasma enhanced chemical vapor deposition (PECVD) process or by a spin coating process.

Figure 1D:
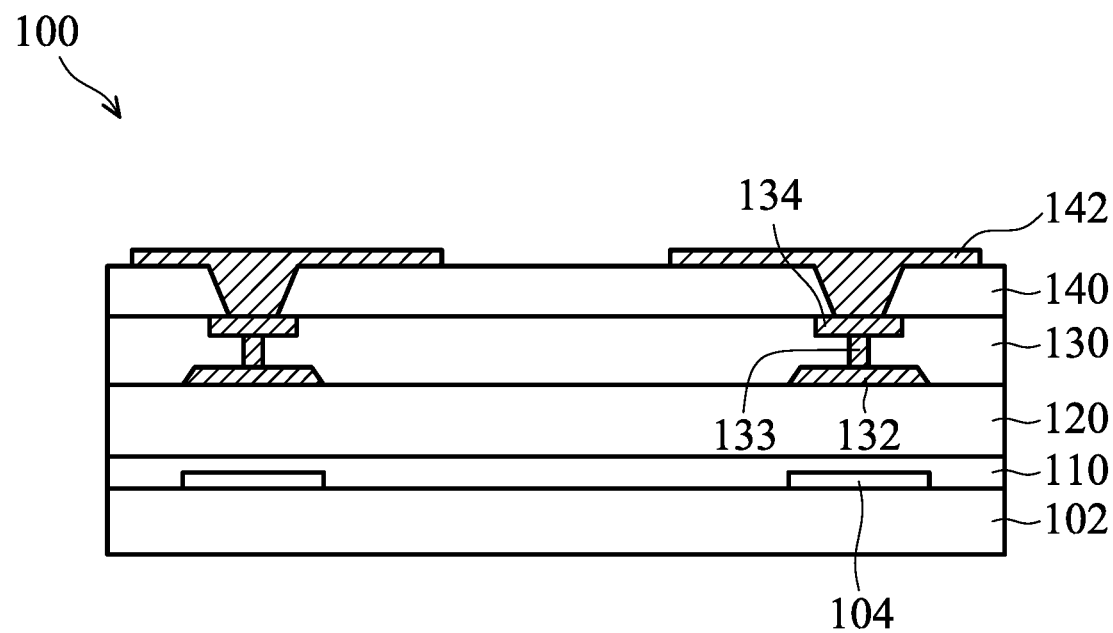

Afterwards, as shown in FIG. 1D, a conductive pad 142 is formed in the openings 137 and over the insulating layer 140, in accordance with some embodiments of the disclosure. The conductive pad 142 is electrically connected to the second metal layer 134.

The conductive pad 142 is made of conductive material, such as copper (Cu), copper alloy, aluminum (Al), aluminum alloy, tungsten (W), tungsten alloy, titanium (Ti), titanium alloy, tantalum (Ta) or tantalum alloy. The conductive pad 142 may be formed by plating, electroless plating, sputtering or chemical vapor deposition (CVD). In some embodiments, the conductive pad 142 is formed by filling a conductive material such as a metal material into openings 137 and on the insulating layer 140. Afterwards, the excess conductive material is removed by a chemical mechanical polishing (CMP) process.

Figure 1E:
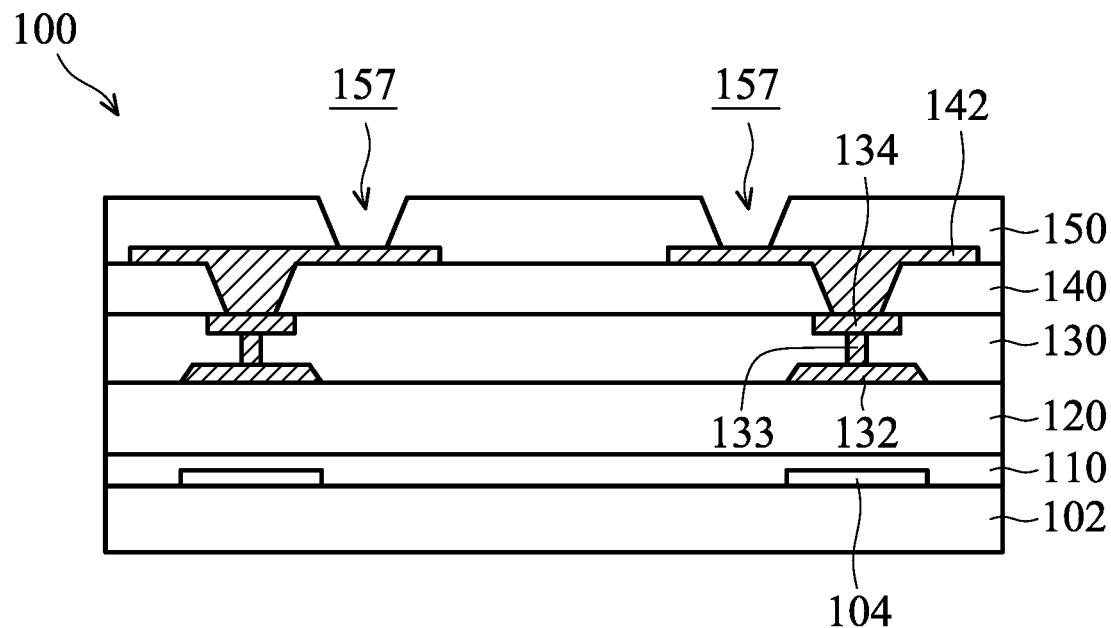

Afterwards, as shown in FIG. 1E, a protection layer 150 is formed over the insulating layer 140, in accordance with some embodiments of the disclosure. The openings 157 are formed in the protection layer 150 to expose a selective portion of the top surface of the conductive pad 142. The protection layer 150 is used to protect the underlying layer from being damaged.

The protection layer 150 is made of inorganic materials such as silicon nitride, silicon oxide, silicon oxynitride, HMDS (hexamethyldisilazane) or a combination thereof. Alternatively, the protection layer 150 is made of a polymer, such as polyimide (PI), epoxy, solder resist (SR), fluorine (F)-containing polymer or combinations thereof. The protection layer 150 is formed by a chemical vapor deposition (CVD) process or a spin coating process.

Figure 1F:
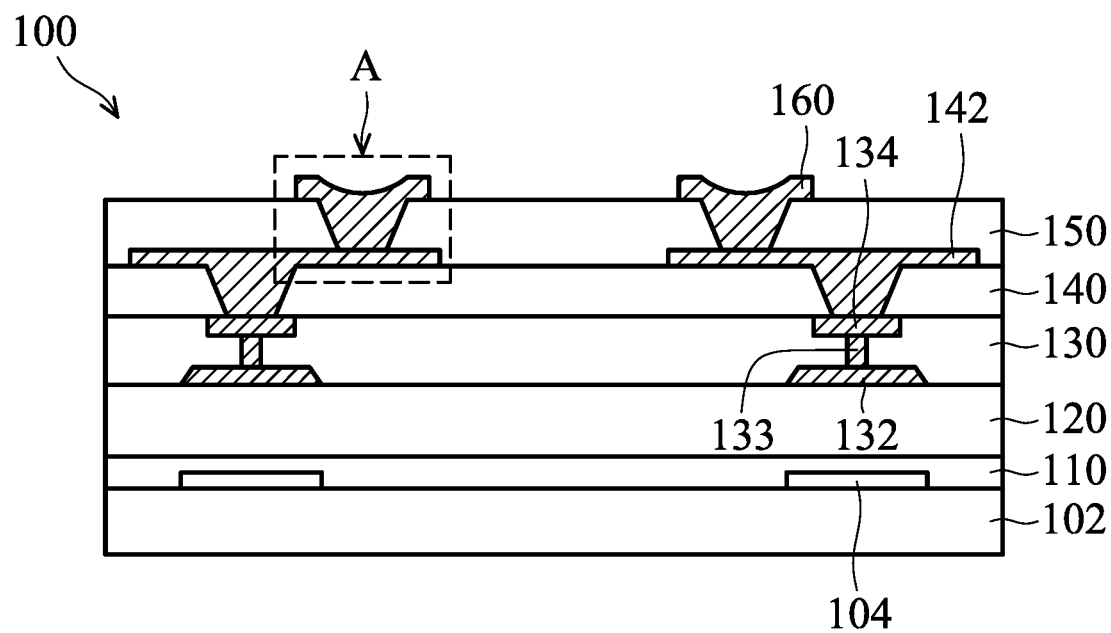

Afterwards, as shown in FIG. 1F, a conductive structure 160 is formed in the openings 157 and over the protection layer 150 in accordance with some embodiments of the disclosure.

The conductive structure 160 is made of conductive materials, such as copper (Cu), copper alloy, gold (Au), gold alloy, silver (Ag), silver alloy, or other suitable materials. The conductive structure 160 may be formed by an electroplating process, an electroless plating process, a sputtering process or a chemical vapor deposition (CVD) process. In some embodiments, the electroplating process is used, and the plating bath includes $CuSO_4$, HCl, $H_2SO_4$, suppressor and additives.

The conductive structure 160 may serve as a contact interface with a chip probing (CP) system during integrated packaging process. The chip probing process may be beneficial in ensuring that only known good dies (KGD) are integrated into a packaged chip product, thereby increasing productive efficiency and lowering overall cost. In some embodiments, when the conductive structure 160 is formed by electroplating, the lateral cross-sectional profile of the conductive structure 160 is dependent on the deposited thickness of the conductive structure 160. If the conductive structure 160 is deposited over 20 μm, the top surface of the conductive structure 160 will be flat. In some practical situations, a flat surface may not provide an optimum probing interface for the miniature probing pins of a CP system. Accordingly, in some embodiments, the conductive structure 160 is deposited at a thickness of less than 20 μm or even less than 10 μm, so as to affect the generation of a non-flat top surface (e.g., a curved, concave/convex top surface).

Figure 2A:
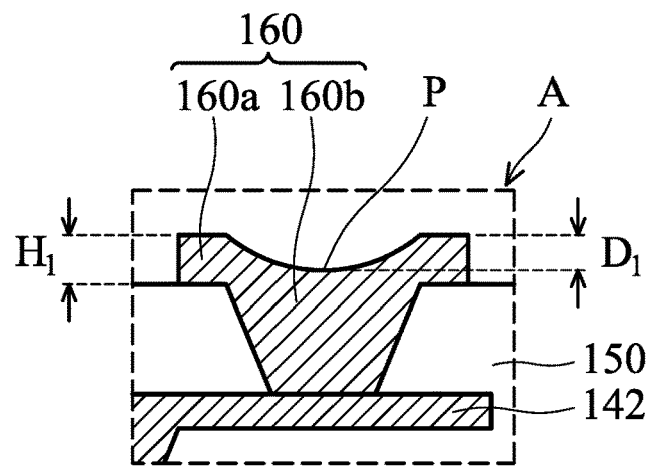
FIG. 2A shows an enlarged cross-sectional representation of region A of FIG. 1F, in accordance with some embodiments of the disclosure.

FIG. 2A shows an enlarged cross-sectional representation of region A of FIG. 1F, in accordance with some embodiments of the disclosure. The conductive structure 160 of the instant example has generally concave profile, which comprises an higher edge portion 160a and a lower middle portion 160b, where the middle portion 160b is surrounded by the edge portion 160a. The top surface of the edge portion 160a is substantially planar and is substantially parallel to the top surface of the protection layer 150. In contrast, the middle portion 160b is not parallel to the top surface of the protection layer 150 and has a curved top surface.

As shown in FIG. 2A, the conductive structure 160 defines a first height $H_1$, which is measured from the top surface of the protection layer 150 to the top surface of the edge of the conductive structure 160. The conductive structure 160 has a concave top surface that defines an apex (e.g., the lowest point P). The apex (e.g., point P) of the concave top surface is a first depth $D_1$ from the top surface of the edge portion 160a. The lowest point P of the middle portion 160b is higher than the top surface of the protection layer 150. The first height $H_1$ is greater than the first depth $D_1$ to provide an optimum probing interface for the miniature probing pins of a CP system.

Figure 1G:
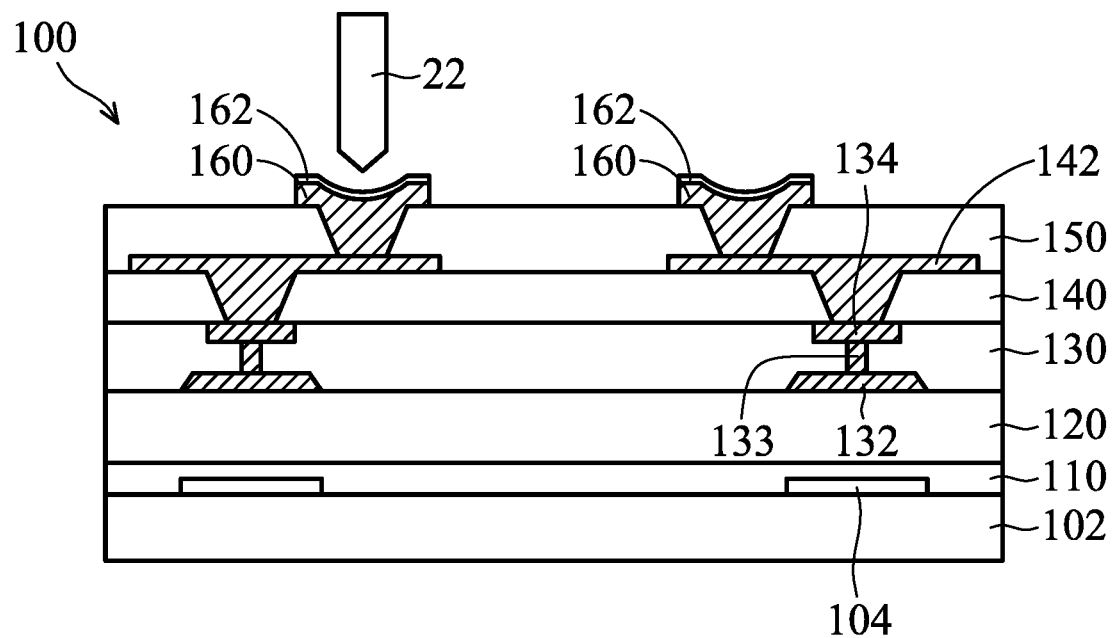

As shown in FIG. 1G, after the conductive structure 160 is formed, a solder material 162 is formed over the conductive structure 160 to provide a reliable probing interface for the probe (e.g., pin head) 20 during a functional test in accordance with some embodiments of the disclosure.

The probe 22 of a CP system is configured to probe the solder material 162 to determine the function of the device element 104. During the functional test, the probe 22 is moved to a location above the solder material 162 and comes into contact with the solder material 162, so as to check the electrical function of the underlying conductive structure 160. The solder material 162 is used as an adhesion layer to enhance the electrical contact performance between the probe 22 and the conductive structure 160. In addition, the solder material 162 is used to protect the conductive structure 160 from being damaged by the probe 22.

The solder material 162 is conformally formed on the conductive structure 160, and the profile of the solder material 162 substantially conforms to that of the conductive structure 160. In addition, the thickness of the solder material 162 is smaller than the thickness of the conductive structure 160. Therefore, the solder material 162 has a non-flat or curved cross-sectional profile. In some embodiments, a ratio of the thickness of conductive structure 160 to the thickness of the solder material 162 is in a range from about 1.5 to about 5. Since the solder material 162 also have non-flat top surface, the non-flat top surface provides an optimum probing interface for the miniature probing pins of a CP system.

Figure 4:
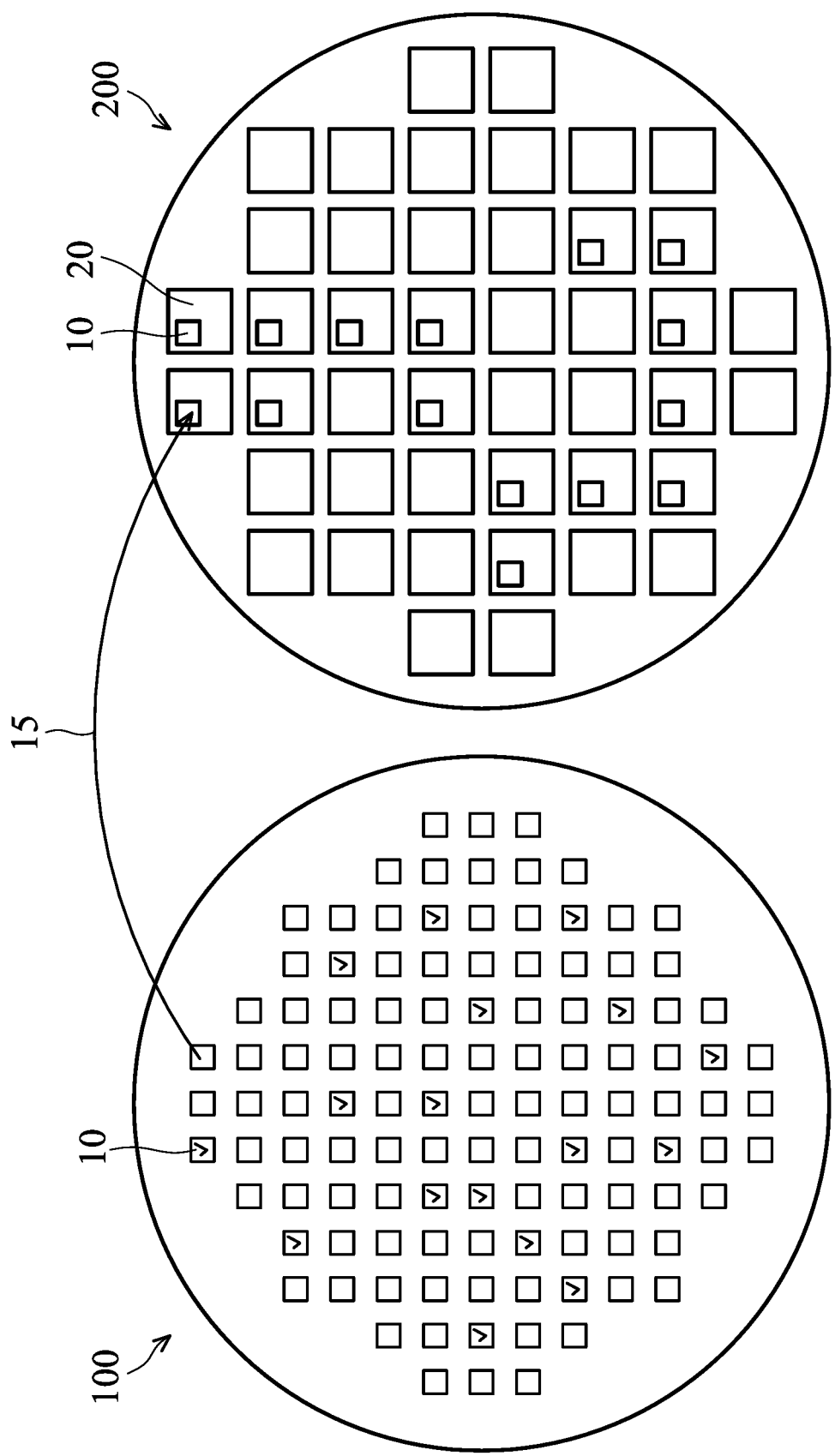
FIG. 4 shows a die-on-wafer structure in accordance with some embodiments of the disclosure.

As shown in FIG. 4, the device elements 104 (on the wafer 100) that pass the functional test will be marked as good first dies, (e.g., marked with some marks, like a tick, on the top surface of the first dies 10). After the functional test, some "known good dies (KGD)" are marked. The functional test is used to check the function of the device elements 104 to ensure the quality of the dies 10. Therefore, the yield of the package structure may be improved.

Figure 1H:
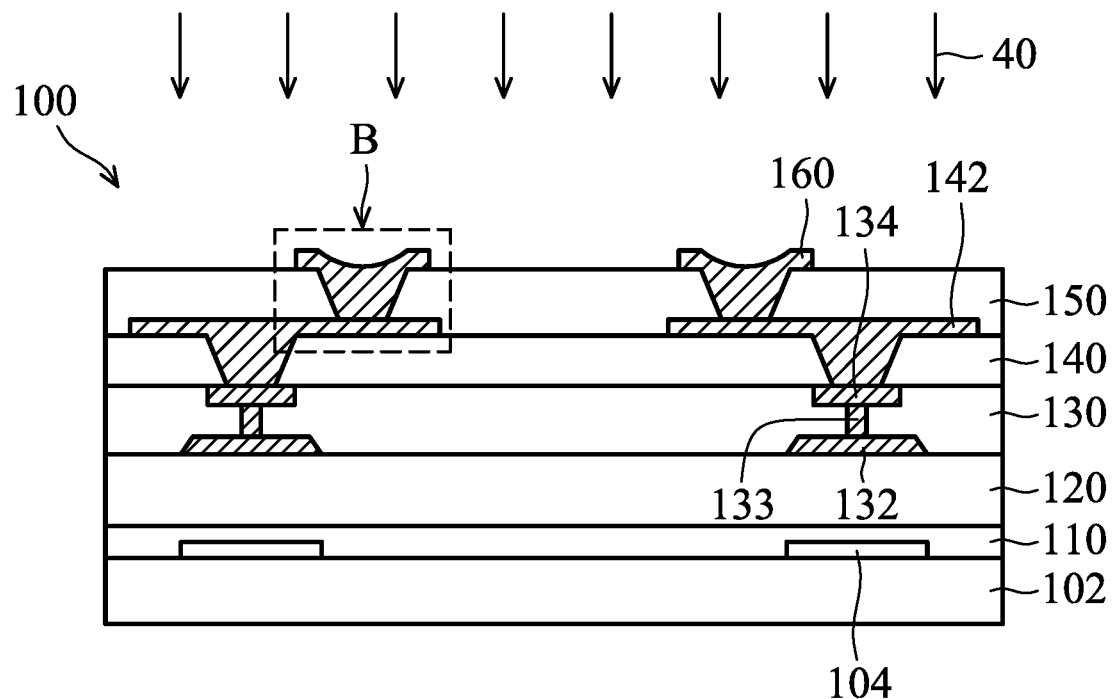

As shown in FIG. 1H, after the functional test, the solder material 162 is removed, in accordance with some embodiments of the disclosure. In some embodiments of the disclosure, an etching process 40 is performed over the solder material 162 to remove the solder material 162. Since the solder material 162 is thinner than the conductive structure 160, it is easy to remove the solder material 162 without damaging the original profile of the conductive structure 160. After the etching process 40 for removing the solder material 162, the concave top surface remains on the conductive structure 160.

In some embodiments, the etching process 40 is a wet etching process, and the etchant includes HF, $H_2SO_4$, HCl, $HNO_3$, $H_2O_2$ or combination thereof. Accordingly, the post probing removal of the solder material 162 may be conducted without a chemical mechanical polish procedure.

Figure 2B:
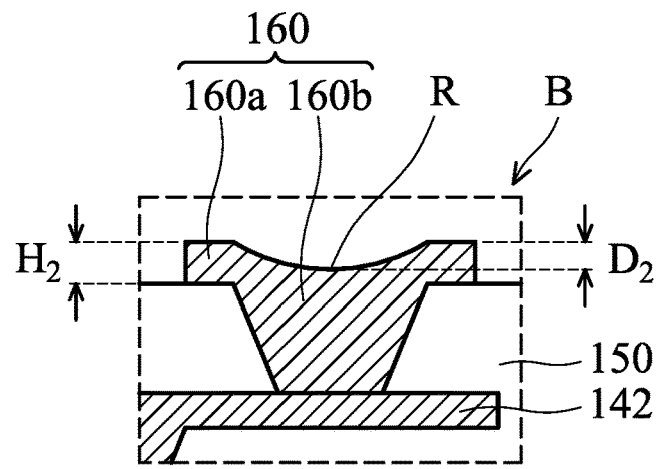
FIG. 2B shows an enlarged cross-sectional representation of region B of FIG. 1H, in accordance with some embodiments of the disclosure.

FIG. 2B shows an enlarged cross-sectional representation of region B of FIG. 1H, in accordance with some embodiments of the disclosure. The conductive structure 160 has a higher edge portion 160a and a lower middle portion 160b, where the middle portion 160b is surrounded by the edge portion. The top surface of the edge portion 160a is substantially parallel to the top surface of the protection layer 150. The curved top surface remains on the middle portion 160b of the conductive structure 160 after the etching process 40.

After the etching process 40, the overall structural profile of the conductive structure 160 substantially remains. For example, the post-etching structure 160 has a second height $H_2$ which is measured from the top surface of the protection layer 150 to the top surface of the edge portion 160a of the conductive structure 160. The conductive structure 160 has a concave top surface, and the concave top surface at the lowest point R has a second depth $D_2$ from the top surface of the edge portion 160a. The lowest point R of the middle portion 160b is higher than the top surface of the protection layer 150. The second height $H_2$ remains greater than the second depth $D_2$. In some embodiments, the second height $H_2$ is in a range from about 2 μm to about 9 μm. In some other embodiments, the second depth $D_2$ is in a range from about 1 μm to about 4.5 μm. In some embodiments, a ratio of the second height $H_2$ to the second depth $D_2$ is in a range from about 1.1 to about 9. It should be noted that, the height to depth profile ratio of the conductive structure 160 should be mindfully controlled, as an insufficient ratio will result in less satisfactory contact interface with a CP system (e.g., probe head 20), while large a ratio may result in increased electrical resistance. For example, If the ratio is larger than 9, the electrical resistance will be overly large to cause undesirable RC signal delay. Conversely, if the ratio is smaller than 1.1, the electrical contact performance (with the probing head 20) may be impaired. The wet etching scheme in accordance with the instant disclosure offers effective control over the profile generation of the conductive structure 160, and provides a more streamline and cost-effective package probing process.

Referring again to FIG. 2B, compared with the pre-etch structural as shown in FIG. 2A, the second height $H_2$ of the post-etching conductive structure 160 is slightly lower than the first height $H_1$, and the second depth $D_2$ is slightly smaller than the first depth $D_1$.

It should be noted that, if the solder material 162 is removed by a polishing process, such as a chemical polishing process (CMP), a higher/thicker conductive material 160 below the solder material 162 would be required to compensate for excess material removal. In other words, in order to prevent the conductive structure 160 from being damaged by the CMP process, the conductive structure 160 has to be over-deposited to form a thick conductive structure, such as more than 20 μm. However, the over-deposited material of the conductive structure 160 constitutes extra waste of material as it will be removed by the subsequent CMP process. The etching process 40 in accordance with the instant disclosure may allow conductive structure 160 of thinner profiles to be used (such as less than 10 μm). Therefore, the amount of the material needed to form the conductive structure 160 and the fabrication time and cost are significantly reduced. In addition, since the CMP process may create a significant amount of debris, which may contaminate the wafer and the structure formed thereon, using the etching process 40 instead of the CMP process can prevent further damage to the wafer and the structure formed thereon, and make the subsequent cleaning process easier.

Furthermore, if the solder material 162 is removed by the CMP process, the top surface of the conductive structure 160 will be affected and become flat after the CMP process. However, in the illustrated embodiments, since the step of removing the solder material 162 is performed by the etching process 40 without using a CMP process, when the solder material 162 is removed by the etching process 40, the curved top surface remains on the conductive structure 160 after the etching process 40.

The conductive structure 160 with a non-flat/curved top surface and thinner thickness has a higher conductivity. Therefore, the performance of the semiconductor device structure is improved. In some embodiments, the conductivity of the concave top surface of the conductive structure 160 provides enhanced conductivity in a range from about 30% to about 55%, compared to the conductivity of the flat top surface of the conductive structure 160. Benefits provided by embodiments of the disclosure may include good electrical contact during functional test, good electrical performance (less RC delay), and good adhesion between conductive structure 160 and PPI structure 234.

Figure 1I:
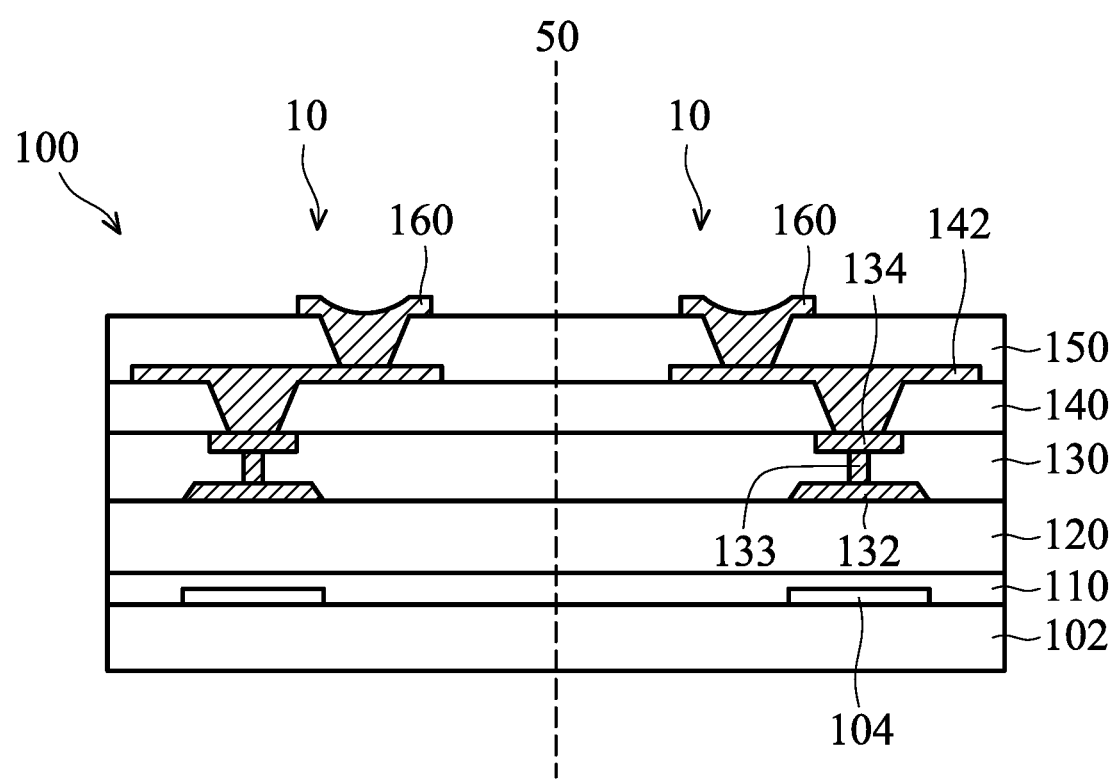

Afterwards, as shown in FIG. 1I, the first wafer 100 is diced along the scribe lines 50 to form a number of dies 10, in accordance with some embodiments of the disclosure.

FIG. 4 shows a die-on-wafer structure in accordance with some embodiments of the disclosure. A second wafer 200 is received, and the second wafer 200 is similar to the first wafer 100. A pick/put machine 15 is used to pick the good first dies 10 on the top of the good second dies 20. Accordingly, a die-on-wafer structure is obtained. It should be noted that the size of each first die 10 is smaller than the size of each second die 20. Therefore, more than one good first dies 10 are put on a single second die 20 of the second wafer 200.

Figure 3:
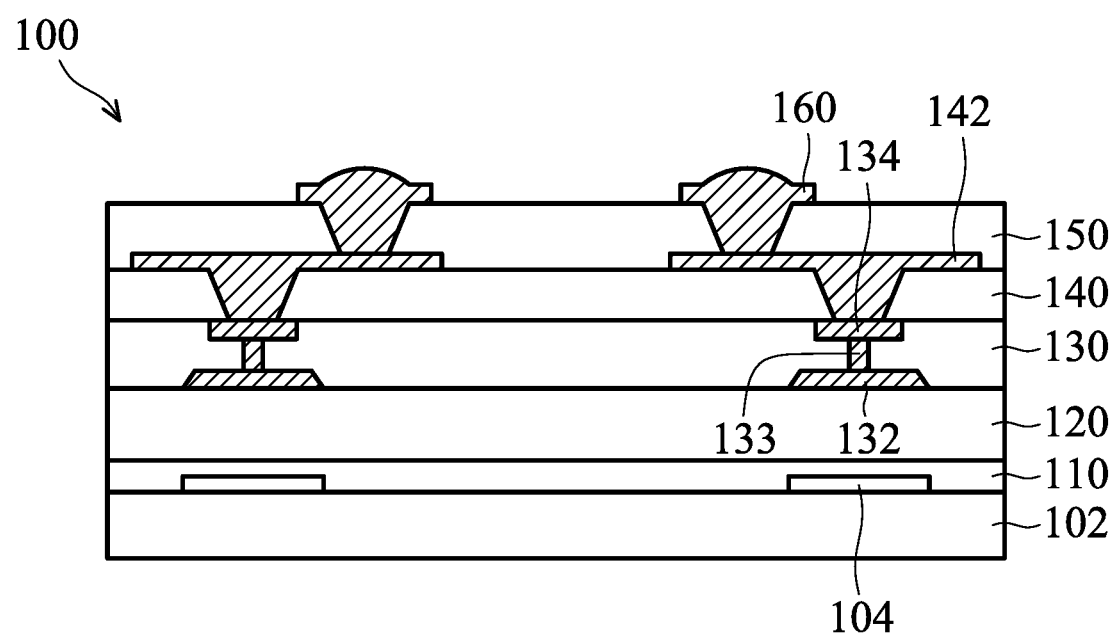
FIG. 3 shows a cross-sectional representation of a semiconductor device structure, in accordance with some embodiments of the disclosure.

FIG. 3 shows a cross-sectional representation of a semiconductor device structure, in accordance with some embodiments of the disclosure. The semiconductor device structure FIG. 3 is similar to the semiconductor device structure shown in FIG. 1H, except that the top surface profile of the conductive structure 160 is different. Processes and materials used to form semiconductor device structure in FIG. 3 may be comparable to those used to form the semiconductor device structure in FIGS. 1A-1H and are not repeated herein.

As shown in FIG. 3, the conductive structure 160 has a non-flat top surface (a curved top surface) after the etching process. In this embodiment, the conductive structure 160 has a convex top surface that defines an apex (e.g., the extremity/highest point of the curved convex surface) after the etching process. It should be noted that a temporary solder material is formed on the conductive structure 160 while a functional test is being performed on the conductive structure 160. After the functional test, the solder material 162 is removed by the etching process 40, rather than by a polishing process, and therefore a convex top surface remains on the conductive structure 160. The conductivity of the convex top surface of the conductive structure 160 is higher than that of the flat top surface of the conductive structure. Therefore, the performance of the semiconductor device structure is improved.

FIGS. 5A-5E shows a fan-out wafer level package structure, in accordance with some embodiments of the disclosure. The fan-out wafer level package means that the I/O pads on the chip structure can be distributed to a greater area than the chip structure, and hence the number of I/O pads on the surface of the chip structure can be increased.

Figure 5A:
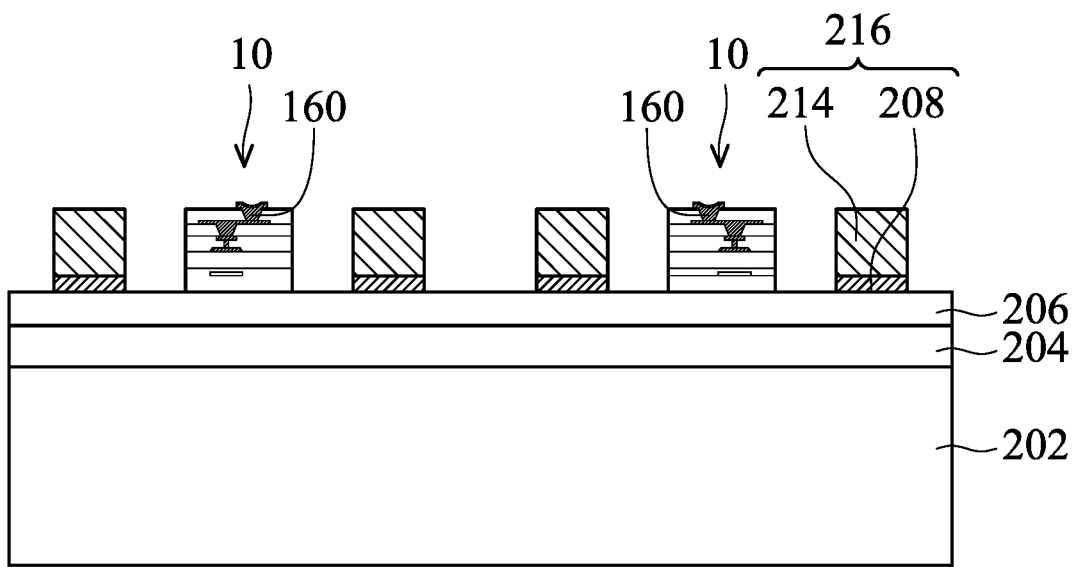
FIGS. 5A-5E shows a fan-out wafer level package structure, in accordance with some embodiments of the disclosure.

As shown in FIG. 5A, a second substrate 202 is received. The second substrate 202 is a temporary support substrate. In some embodiments, the second substrate 202 is made of semiconductor material, ceramic material, polymer material, metal material, another applicable material, or a combination thereof. In some embodiments, the second substrate 202 is a glass substrate. In some embodiments, the second substrate 202 is a semiconductor substrate, such as silicon wafer.

An adhesive layer 204 is formed on the second substrate 202. In some embodiments, the adhesive layer 204 is made of glue or foil. In some other embodiments, the adhesive layer 204 is made of a photosensitive material which is easily detached from the second substrate 202 by light irradiation. In some embodiments, the adhesive layer 204 is made of a heat-sensitive material.

Afterwards, a base layer 206 is formed on the adhesive layer 204. In some embodiments, the base layer 206 is made of polymer or a polymer-containing layer. The base layer 206 may be a poly-p-phenylenebenzobisthiazole (PBO) layer, a polyimide (PI) layer, a solder resist (SR) layer, an Ajinomoto buildup film (ABF), a die attach film (DAF), another applicable material, or a combination thereof. In some embodiments, the adhesive layer 204 and the base layer 206 are deposited or laminated over the second substrate 202.

Afterwards, a seed layer 208 is formed over the base layer 206. In some embodiments, the seed layer 208 is made of conductive material, such as titanium copper (TiCu), titanium tungsten copper (TiWCu), or tantalum nitrogen copper (TaNCu) or a combination thereof. In some embodiments, the seed layer 208 is formed by a deposition process, such as a chemical vapor deposition process (CVD), a physical vapor deposition process (PVD), another applicable process, or a combination thereof.

A conductive pillar structure 214 is formed over the seed layer 208. The conductive pillar structure 214 may be made of metal material, such as copper (Cu), aluminum (Al), tungsten (W), nickel (Ni), an alloy thereof, or a combination thereof.

As a result, the conductive pillar structure 214 and the seed layer 208 are in combination referred to as through InFO vias (TIV) 216, which are also referred to as through-vias 216. In some embodiments, the conductive pillar structure 214 and the seed layer 208 are made of the same material, and therefore there is no distinguishable interface therebetween.

Figure 5B:
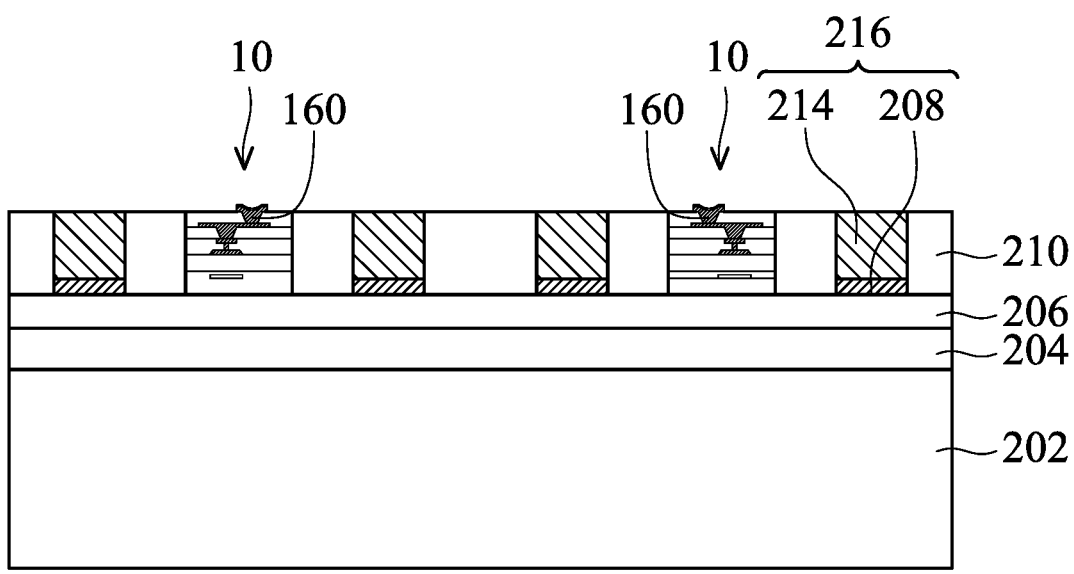

The first dies 10 are formed over the first substrate 102 of the first wafer 100, as shown in FIG. 1A-FIG. 1I. Afterwards, as shown in FIG. 5B, one of the good first dies 10 is formed over the base layer 206, in accordance with some embodiments of the disclosure.

Afterwards, a package layer 210 is formed adjacent to the die 10 and the conductive pillar structure 214. The die 10 is insulated from the conductive pillar structure 214 by the package layer 210. More specifically, the device element 104 of the die 10 is insulated from the conductive pillar structure 214 by the package layer 210.

The package layer 210 is made of a molding compound, such as liquid epoxy, deformable gel, a resin, polyimide, polybenzoxazole (PBO), benzocyclobutene (BCB), a silicone, an acrylate or the like. The top surface of the die 10 is substantially level with that of the conductive pillar structure 214.

Figure 5C:
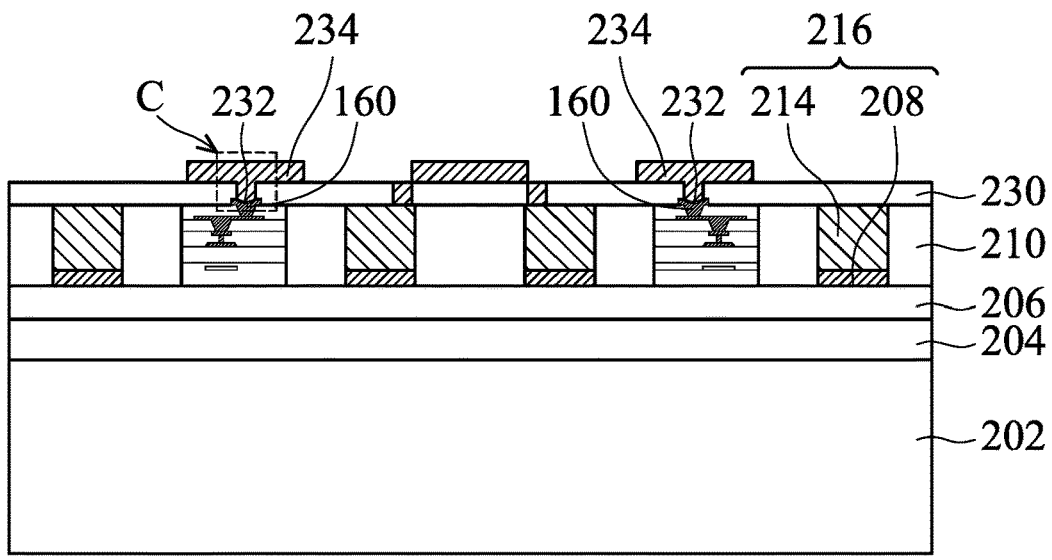

Afterwards, as shown in FIG. 5C, a first passivation layer 230 is formed over the die 10 and the conductive pillar structure 214, in accordance with some embodiments of the disclosure. Then, the first passivation layer 230 is patterned to expose the curved top surface of the conductive structure 160, and a seed layer 232 is formed over the curved top surface of the conductive structure 160.

The seed layer 232 is self-aligned over conductive structure 160 by the electroless method without using a tedious photolithography process. The seed layer 232 is made of metal material, such as titanium copper (TiCu), titanium tungsten copper (TiWCu), or tantalum nitrogen copper (TaNCu) or a combination thereof.

Afterwards, a post-passivation interconnect (PPI) structure 234 is formed over the seed layer 232. The PPI structure 234 is electrically connected to the conductive structure 160 via the seed layer 232.

The seed layer 232 is relatively thin compared to the conductive structure 160. In some embodiments, the thickness of the seed layer 232 is in a range from about 1 μm to about 6 μm. Accordingly, the topography of the seed layer 232 is similar to that of the conductive structure 160 when the seed layer 232 is conformally formed on the conductive structure 160. The seed layer 232 has a concave top surface and a concave bottom surface.

It should be noted that the seed layer 232 and the conductive structure 160 are made of different materials, and therefore the interface between different materials can be observed. In other words, the curved top surface of the conductive structure 160 can be observed in the fan-out wafer level package structure. In addition, the seed layer 232 and the PPI structure 234 are made of different materials, and therefore the curved top surface of the seed layer 232 also can be observed.

Figure 6:
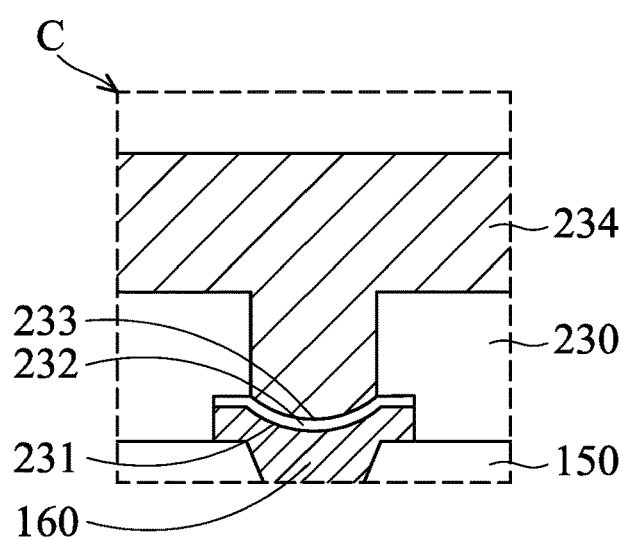
FIG. 6 shows an enlarged cross-sectional representation of region C of FIG. 5C, in accordance with some embodiments of the disclosure.

FIG. 6 shows an enlarged cross-sectional representation of region C of FIG. 5C, in accordance with some embodiments of the disclosure. The concave top surface of the conductive structure 160 is in direct contact with the concave bottom surface of the seed layer 232. The curved bottom surface of the PPI structure 234 is in direct contact with the concave top surface of the seed layer 232.

It should be noted that the seed layer 232 and the conductive structure 160 are made of different materials, and therefore there is a first interface 231 between the conductive structure 160 and the seed layer 232. In addition, the seed layer 232 and the PPI structure 234 are made of different materials, and therefore there is a second interface 233 between the PPI structure 234 and the seed layer 232. The first interface 231 and the second interface 233 are not parallel to the top surface of the first passivation layer 230. In other words, the curved top surface of the conductive structure 160 is in contact with the curved bottom surface of the seed layer 232 to form the first interface 231, and the curved top surface of the seed layer 232 is in contact with the bottom surface of the PPI structure 234 to form the second interface 233.

Figure 5D:
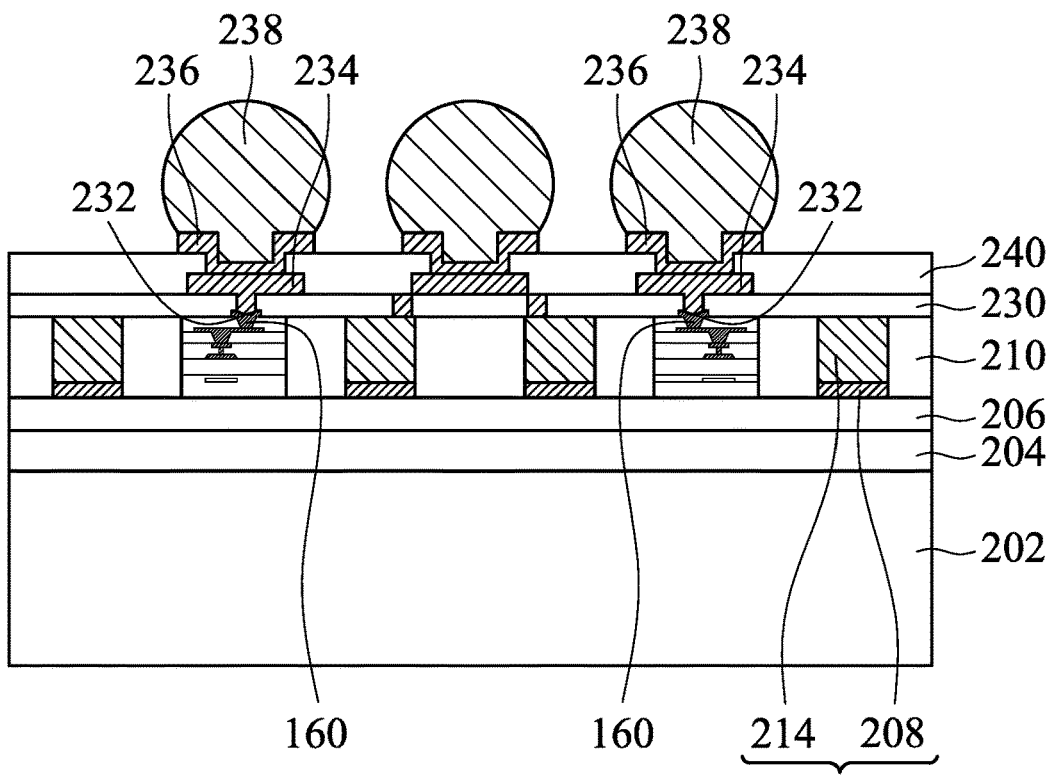

After the PPI structure 234 is formed, a second passivation layer 240 is formed over the first passivation layer 230. Afterwards, a trench is formed in the second passivation layer 240 to expose the top surface of the PPI structure 234. Then, as shown in FIG. 5D, an under bump metallurgy (UBM) layer 236 is formed in the trench, in accordance with some embodiments of the disclosure. Afterwards, an electrical connector 238 is formed over the UBM layer 236. The PPI structure 234 is electrically connected to the conductive structure 160 via the seed layer 232, and the electrical connector 238 is electrically connected to the PPI structure 234 via the UBM layer 236.

The UBM layer 236 may be made of conductive material, such as titanium (Ti), titanium nitride (TiN), tantalum nitride (TaN), tantalum (Ta), tungsten (W), tungsten alloy, titanium alloy or tantalum alloy. In addition, the UBM layer 236 may contain an adhesion layer and/or a wetting layer. In some embodiments, the UBM layer 236 further includes a copper (Cu) seed layer. In some embodiments, the UBM layer 236 is formed by plating, electroless plating, or sputtering.

The electrical connector 238 is made of conductive material, such as copper (Cu), copper alloy, aluminum (Al), aluminum alloy, tungsten (W), tungsten alloy, titanium (Ti), titanium alloy, tantalum (Ta) or tantalum alloy. In some embodiments, the electrical connector 238 is formed by plating, electroless plating, sputtering or chemical vapor deposition (CVD).

Figure 5E:
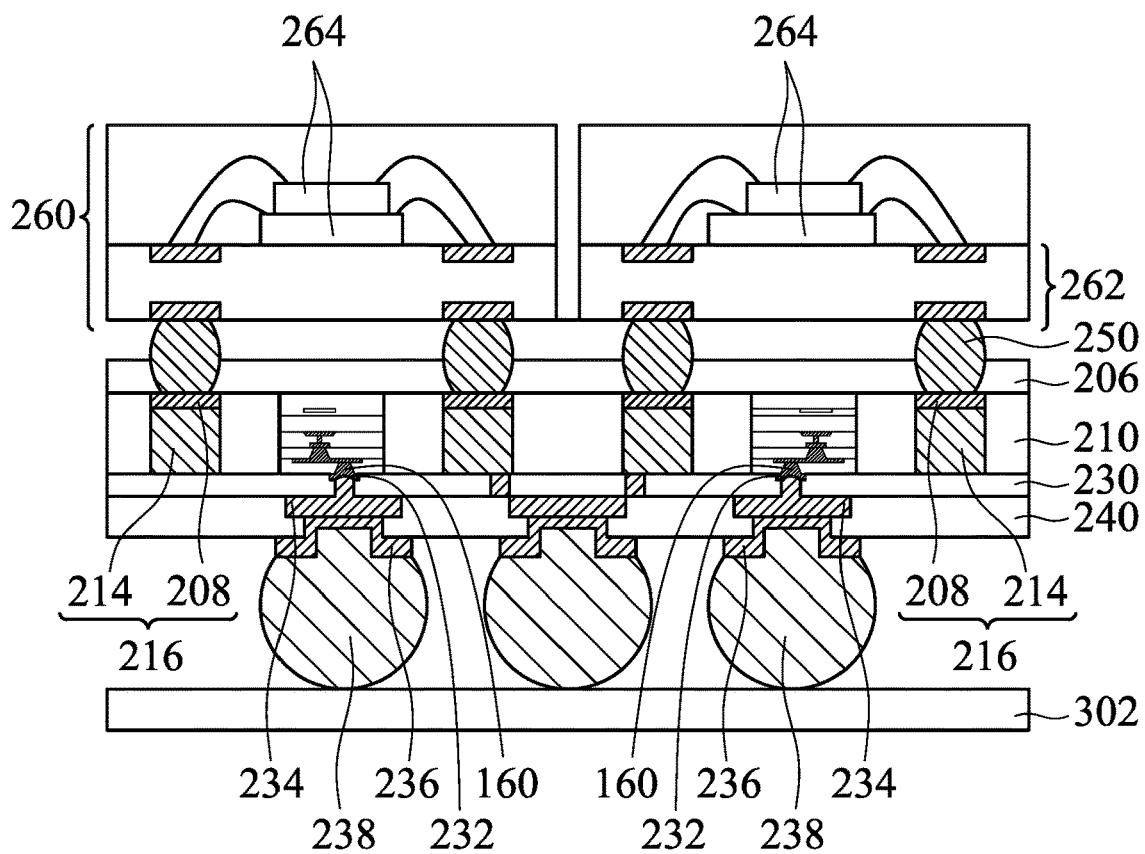

Afterwards, as shown in FIG. 5E, the second substrate 202 and the adhesive layer 204 are removed, and the structure of FIG. 5D is flipped and attached to a carrier 302, in accordance with some embodiments of the disclosure. As a result, the base layer 206 faces up and is exposed. The carrier 302 includes a tape which is photosensitive or heat-sensitive and is easily detached from the electrical connector 238.

Afterwards, a portion of the base layer 206 is removed to form openings (not shown). In some embodiments, a portion of the seed layer 208 is removed, and the seed layer 208 is exposed. In some other embodiments, the seed layer 208 is not removed or is completely removed. In some other embodiments, the openings are formed by a laser drilling process, an etching process, or another applicable process.

After the openings are formed, an electrical connector 250 is filled into the openings. Afterwards, a top package structure 260 is bonded to the electrical connector 250. The top package structure 260 includes a package substrate 262 and semiconductor dies 264. In some embodiments, the semiconductor dies 264 include memory dies, such as a Static Random Access Memory (SRAM) die, a Dynamic Random Access Memory (DRAM) die or the like.

The conductive pillar structure 214 has a first surface and a second surface opposite to the first surface, the PPI structure 234 is formed over the first surface of the conductive pillar structure 214. The top package structure 260 is formed over the second surface of the conductive pillar structure 214, and the top package structure 260 is electrically connected to the conductive pillar structure 214 by the electrical connector 250.

Afterwards, the semiconductor structure may continue to undergo other processes to form other structures or devices. Afterwards, a dicing process is performed to separate the structure of FIG. 5E into chip packages.

Embodiments for forming a semiconductor device structure and method for formation the same are provided. A conductive pad is formed over a substrate, and a conductive structure is formed over the conductive pad. A temporary solder material is formed on the conductive structure while a functional test is being performed on the conductive structure. After the functional test, the solder material is removed by an etching process, rather than by a polishing process. Therefore, a concave or convex top surface remains on the conductive structure. The conductivity of the concave or the convex top surface of the conductive structure is higher than that of the flat top surface of the conductive structure. Therefore, the performance of the semiconductor device structure is improved.

In some embodiments, a method for forming a semiconductor device structure is provided. The method includes forming a conductive pad over the substrate, and forming a protection layer over the conductive pad. The method also includes forming a conductive structure accessibly arranged through the protection layer and electrically connected to the conductive pad, and the conductive structure has a curved top surface. A lowest point of the curved top surface of the conductive structure is higher than a topmost surface of the protection layer.

In some embodiments, a method for forming a semiconductor device structure is provided. The method includes forming a conductive pad over the substrate, and forming a conductive structure over the conductive pad. The conductive structure has a middle portion and an edge portion, the middle portion has a curved top surface, and the edge portion has a planar top surface. The method also includes forming a seed layer over the conductive structure, and forming a passivation layer over the seed layer. The edge portion of the conductive structure is embedded in the passivation layer.

In some embodiments, a method for forming a semiconductor device structure is provided. The method includes forming a die comprising a conductive pad, and forming a conductive structure below the conductive pad. The conductive structure has a curved bottom surface with a lowest point. The method also includes forming a passivation layer below the conductive structure. The lowest point of the conductive structure is between a bottom surface of the passivation layer and a bottom surface of the conductive pad. The method includes forming a top package structure over the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a conductive pad over a substrate;
    forming a protection layer over the conductive pad;
    forming a conductive structure accessibly arranged through the protection layer and electrically connected to the conductive pad, wherein the conductive structure has a curved top surface, and a lowest point of the curved top surface of the conductive structure is higher than a topmost surface of the protection layer;
    forming a seed layer over the conductive structure; and
    forming a post-passivation interconnect (PPI) structure over the conductive structure, wherein the PPI structure has a bottom portion in direct contact with the seed layer and a top portion over the bottom portion, the top portion is wider than the bottom portion, and the seed layer is wider than the bottom portion.

2. The method for forming the semiconductor device structure as claimed in claim 1, wherein the seed layer has a curved top surface.

3. The method for forming the semiconductor device structure as claimed in claim 1, further comprising:
    forming an under bump metallurgy (UBM) layer over the PPI structure; and
    forming an electrical connector over the UBM layer, wherein the PPI structure has a curved bottom surface.

4. The method for forming the semiconductor device structure as claimed in claim 1, further comprising:
    forming a passivation layer over the conductive structure, wherein the passivation layer is in direct contact with the curved top surface and sidewalls of the conductive structure.

5. The method for forming the semiconductor device structure as claimed in claim 1, further comprising:
    forming a solder material on the conductive structure; and
    removing the solder material by an etching process, such that the curved top surface remains on the conductive structure after the etching process.

6. The method for forming the semiconductor device structure as claimed in claim 1, further comprising:
    forming a conducive pillar structure adjacent to the conductive structure, wherein the conductive structure is surrounded by the conductive pillar structure.

7. The method for forming the semiconductor device structure as claimed in claim 6, further comprising:
    forming a package structure adjacent to the conducive pillar structure, wherein the conductive structure is insulated from the conducive pillar structure by the package structure.

8. The method for forming the semiconductor device structure as claimed in claim 1, wherein the conductive structure has a middle portion and an edge portion, the middle portion has the curved top surface, and the edge portion has a planar top surface.

9. The method for forming the semiconductor device structure as claimed in claim 8, wherein a thickness of the planar top surface of the conductive structure over the protection layer is greater than a height from a lowest point of the curved top surface to the planar top surface of the conductive structure over the protection layer.

10. A method for forming a semiconductor structure, comprising:
    forming a conductive pad over a substrate;
    forming a conductive structure over the conductive pad, wherein the conductive structure has a middle portion and an edge portion, the middle portion has a curved top surface, and the edge portion has a planar top surface;
    forming a seed layer over the conductive structure; and
    forming a passivation layer over the seed layer, wherein the edge portion of the conductive structure is embedded in the passivation layer, wherein a distance between a top surface of the seed layer and a top surface of the substrate is less than a distance between a top surface of the passivation layer and the top surface of the substrate.

11. The method for forming the semiconductor device structure as claimed in claim 10, further comprising:
    forming a post-passivation interconnect (PPI) structure over the conductive structure, wherein the PPI structure has a curved bottom surface;

forming an under bump metallurgy (UBM) layer over the PPI structure; and forming an electrical connector over the UBM layer.

12. The method for forming the semiconductor device structure as claimed in claim 10, further comprising:

forming a protection layer over the conductive pad, wherein a lowest point of the curved top surface of the conductive structure is higher than a topmost surface of the protection layer.

13. The method for forming the semiconductor device structure as claimed in claim 10, wherein a portion of the seed layer is embedded in the passivation layer.

14. The method for forming the semiconductor device structure as claimed in claim 10, further comprising:

forming a conducive pillar structure adjacent to the conductive structure, wherein the conductive structure is surrounded by the conductive pillar structure.

15. The method for forming the semiconductor device structure as claimed in claim 10, further comprising:

forming a solder material on the conductive structure; and removing the solder material by an etching process, such that the curved top surface remains on the conductive structure after the etching process.

16. A method for forming a semiconductor structure, comprising:

forming a die comprising a conductive pad;

forming a conductive structure below the conductive pad, wherein the conductive structure has a curved bottom surface with a lowest point;

forming a seed layer below the conductive structure, wherein the seed layer is in direct contact with the conductive structure and has a curved top surface facing the conductive structure;

forming a passivation layer below the conductive structure, wherein the lowest point of the conductive structure is between a bottom surface of the passivation layer and a bottom surface of the conductive pad, and the bottom surface of the passivation layer is lower than a bottom surface of the seed layer; and forming a top package structure over the die.

17. The method for forming the semiconductor device structure as claimed in claim 16, further comprising:

forming a post-passivation interconnect (PPI) structure below the seed layer, wherein the bottom surface of the seed layer is a curved bottom surface.

18. The method for forming the semiconductor device structure as claimed in claim 17, further comprising:

forming an under bump metallurgy (UBM) layer below the PPI structure; and forming an electrical connector below the UBM layer.

19. The method for forming the semiconductor device structure as claimed in claim 16, further comprising:

a conducive pillar structure adjacent to the conductive structure, wherein the conductive structure is surrounded by the conductive pillar structure; and forming a package structure adjacent to the conducive pillar structure, wherein the conductive structure is insulated from the conducive pillar structure by the package structure.

20. The method for forming the semiconductor device structure as claimed in claim 16, further comprising:

forming a solder material on the conductive structure; and removing the solder material by an etching process, such that the curved bottom surface remains on the conductive structure after the etching process.

* * * * *